US010601204B2

United States Patent
Bellows et al.

(10) Patent No.: US 10,601,204 B2
(45) Date of Patent: Mar. 24, 2020

(54) ELECTRICAL UNIT FOR A MOTOR CONTROL CENTER WITH INGRESS PROTECTION

(71) Applicant: Rockwell Automation Technologies, Inc., Mayfield Heights, OH (US)

(72) Inventors: Troy M. Bellows, Racine, WI (US); Emily M. Schimek, Milwaukee, WI (US); Tomasz Lorek, Radzionków (PL)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/892,579

(22) Filed: Feb. 9, 2018

(65) Prior Publication Data
US 2019/0252865 A1    Aug. 15, 2019

(51) Int. Cl.
| | | |
|---|---|---|
| *H05K 7/20* | (2006.01) | |
| *H02B 1/28* | (2006.01) | |
| *H02B 1/36* | (2006.01) | |
| *H02B 1/30* | (2006.01) | |
| *H05K 5/02* | (2006.01) | |
| *H02B 1/21* | (2006.01) | |
| *H05K 5/00* | (2006.01) | |

(52) U.S. Cl.
CPC ............. *H02B 1/28* (2013.01); *H02B 1/21* (2013.01); *H02B 1/306* (2013.01); *H02B 1/36* (2013.01); *H05K 5/0017* (2013.01); *H05K 5/023* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 4,693,132 A | * | 9/1987 | Buxton | H02B 11/133 464/39 |
| 6,087,602 A | * | 7/2000 | Bernier | H01H 9/22 200/50.02 |

(Continued)

FOREIGN PATENT DOCUMENTS

| | | |
|---|---|---|
| AT | 397 893 | 7/1994 |
| DE | 36 41 259 | 7/1987 |
| EP | 2 144 342 | 1/2010 |

OTHER PUBLICATIONS

Extended European Search Report for European Application No. 19156191.9-1201 dated Jun. 28, 2019 (8 pages).

*Primary Examiner* — Courtney L Smith
(74) *Attorney, Agent, or Firm* — Boyle Fredrickson S.C.

(57) ABSTRACT

The present inventors have recognized that electrical units for Motor Control Centers (MCC's) can be improved to allow testing in a partially disconnected state while providing ingress protection through the use of sealing members without decreasing the size of the electrical unit. In particular, a full size electrical unit, able to advantageously accommodate a full array of electrical components like most other electrical units, can be partially withdrawn from an MCC for testing while still providing protection from the possibility of shock, gases and/or other hazards by way of sealing members such as gaskets and/or plates. Such sealing members can be mounted to the electrical unit to effectively seal the electrical unit with respect to the MCC when partially withdrawn.

20 Claims, 9 Drawing Sheets

(56) References Cited

U.S. PATENT DOCUMENTS

| | | | | |
|---|---|---|---|---|
| 6,284,989 | B1* | 9/2001 | Bernier | H01H 9/223 200/50.12 |
| 6,512,669 | B1* | 1/2003 | Goodwin | H02B 1/28 200/50.12 |
| 7,419,394 | B2 | 9/2008 | Jensen et al. | |
| 9,531,169 | B2* | 12/2016 | Oneufer | H02B 1/46 |
| 9,722,380 | B1* | 8/2017 | Bayer | H01R 13/6658 |
| 9,859,068 | B2* | 1/2018 | Oneufer | H01H 71/56 |
| 9,888,589 | B2* | 2/2018 | Oneufer | H02B 1/36 |
| 10,186,847 | B2* | 1/2019 | Kroushl | H01H 9/22 |
| 2010/0157512 | A1* | 6/2010 | Yee | H02B 1/36 361/614 |
| 2011/0110049 | A1* | 5/2011 | Lehtola | H05K 7/1409 361/724 |
| 2014/0362498 | A1* | 12/2014 | Morris | F02D 11/02 361/624 |
| 2017/0237245 | A1* | 8/2017 | Ledgerwood | H02G 3/088 220/3.8 |

* cited by examiner

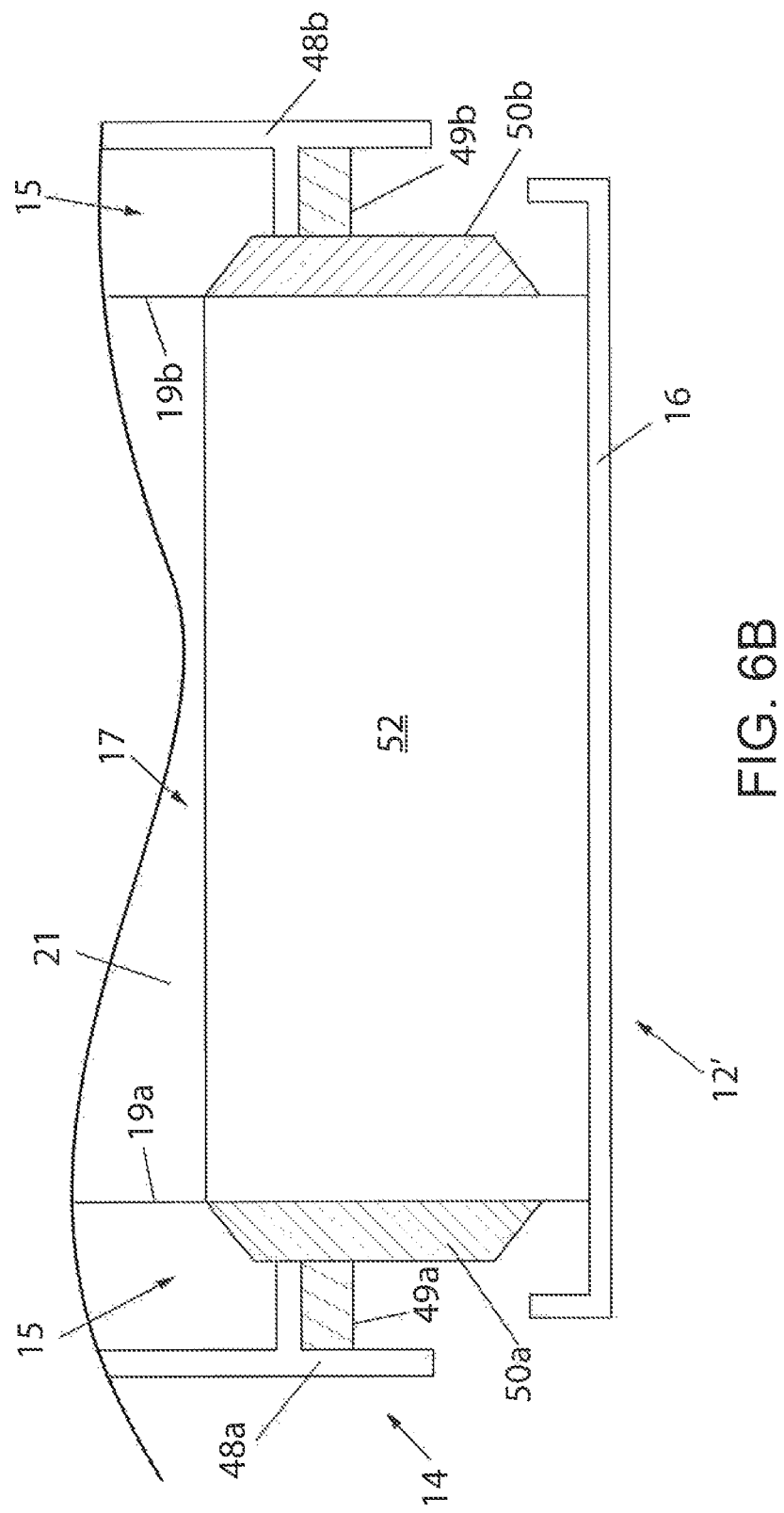

ELECTRICAL UNIT FOR A MOTOR CONTROL CENTER WITH INGRESS PROTECTION

FIELD OF THE INVENTION

The present invention relates generally to electrical systems, and more particularly, to electrical units for electrical systems, such as Motor Control Centers (MCC's), in which sealing members are attached to such units for providing ingress protection while the unit is only partially inserted in an MCC, such as for testing purposes.

BACKGROUND OF THE INVENTION

Electrical systems with packaged electrical and electronic components are known and are in use. For example, Motor Control Centers (MCC's) are used for power and data distribution in large and industrial operations. In MCC's, a variety of components, such as switchgear, semiconductor power electronic circuits, programmable logic controllers, motor controllers, and so forth, are housed in large electrical enclosures that may be subdivided into sections or columns, which may be further subdivided into compartments. The MCC includes associated bus bars, interconnections and supporting structures for distribution of electrical power to the various compartments.

Typically, the MCC is connected to a main power line that may feed three-phase AC power to horizontal bus bars of the MCC. The horizontal bus bars, in turn, may feed the three-phase power to vertical bus bars disposed in each of the sections or columns of the MCC. The vertical bus bars, in turn, may feed the three-phase power to various electrical units (which typically include electrical components) that are installed in compartments of a section. The electrical units, in turn, may provide power terminals (conductors), such as copper bus bars, for feeding the three-phase power to a system environment, such as motors, as may be required for various applications.

It is often desirable to partially disconnect such electrical units them from the MCC from time to time to perform testing or other diagnostics. A partial disconnection typically means partially withdrawing the electrical unit from the MCC, such that the three-phase power is no longer provided to the electrical unit, but communications and control signals remain connected to the electrical unit. This provides an advantageous state for testing communications and control of electrical components with reduced risk of inadvertently delivering three-phase power. However, partially withdrawing an electrical unit creates gaps between the electrical unit and the MCC, thereby exposing an operator to a potential risk in the event of an arc fault. It is possible to keep the electrical unit fully inserted while moving an interior portion of the electrical unit to provide the partially disconnected state. However, this requires a smaller overall footprint for the interior portion of the electrical unit, thereby limiting the range of electrical components which could be used. A need therefore exists for an improved electrical unit which mitigates one or more of the foregoing disadvantages.

SUMMARY OF THE INVENTION

The present inventors have recognized that electrical units for Motor Control Centers (MCC's) can be improved to allow testing in a partially disconnected state while providing ingress protection through the use of sealing members without decreasing the size of the electrical unit. In particular, a full size electrical unit, able to advantageously accommodate a full array of electrical components like most other electrical units, can be partially withdrawn from an MCC for testing while still providing protection from the possibility of shock, gases and/or other hazards by way of sealing members such as gaskets and/or plates. Such sealing members can be mounted to the electrical unit to effectively seal the electrical unit with respect to the MCC when partially withdrawn.

The use of such sealing members can advantageously meet International Electro Technical Commission Ingress Protection (IP) requirements up to IP-3X (protection against solid objects over 2.5 millimeters, e.g. tools, thick wires) in partially withdrawn positions for test and disconnection.

In one aspect, a system can be provided for increasing ingress protection, thereby increasing arc fault protection, for a withdrawable MCC unit with door closed functionality while it is in the MCC, or moving between intermediary positions in the MCC, such as test and/or disconnected positions. Obtaining a higher ingress protection rating in the disconnected and/or test positions can provide a greater level of protection for an operator installing the unit in the MCC in the event of a short circuit and/or arc fault occurring, by limiting gaps in which pressure and/or debris might escape.

A door can be mounted directly to the electrical unit. Sealing parts can be applied to the outside of the electrical unit, or "insert skeleton" and/or "support pan," to decrease spacing gaps between the unit insert skeleton and the unit opening in the MCC column. Decreasing gaps in such areas can decrease the size of a probe able to penetrate into the unit space, thereby decreasing the risk of an operator accessing a hazardous area within the unit during operation. This increases ingress protection and personnel protection ratings. The sealing parts applied can be designed such that multiple parts can be applied to a single unit and the application of multiple parts can allow for the same protection as the unit space factor increases. Sealing parts could be flexible components, such as gaskets, to seal gaps with greater tolerances, such as on sides of the unit with increased room for lateral movement. Sealing parts could also be rigid components, such as plates, to seal gaps with lesser tolerances, such as on top and/or bottom of the unit with decreased room for movement. Such a system could therefore provide a withdrawable unit with a closed door.

Specifically then, one aspect of the present invention can provide an electrical unit for a Motor Control Center (MCC), including: a support structure for supporting an electrical component configured to receive first and second groups of signals from an MCC; a front wall and opposing sidewalls attached to the support structure, the front wall, the opposing sidewalls and the support structure forming an interior volume of the electrical unit containing the electrical component; an actuating mechanism for selectively moving the support structure with respect to the MCC, the actuating mechanism having a handle protruding through the front wall, the handle being moveable between multiple positions including: a first position corresponding to a connected position in which the support structure is fully inserted in the MCC with the first and second groups of signals being connected; a second position corresponding to a test position in which the support structure is partially inserted in the MCC with the first group of signals being disconnected and the second group of signals being connected; and a third position corresponding to a disconnected position in which the support structure is partially inserted in the MCC with the first and second groups of signals being disconnected; and sealing members attached to the opposing sidewalls in areas external to the interior volume of the electrical unit, in which the sealing members form barriers in gaps leading to an interior volume of the MCC between the opposing sidewalls and the MCC to provide arc fault protection when the support structure is partially inserted in the MCC in the second and third positions.

Another aspect of the present invention can provide an MCC including: a section forming a shell around a device mounting volume for supporting an electrical unit, the electrical unit including: a support structure for supporting an electrical component configured to receive first and second groups of signals from the MCC; a front wall and opposing sidewalls attached to the support structure, the front wall, the opposing sidewalls and the support structure forming an interior volume of the electrical unit containing the electrical component; an actuating mechanism for selectively moving the support structure with respect to the MCC, the actuating mechanism having a handle protruding through the front wall, the handle being moveable between multiple positions including: a first position corresponding to a connected position in which the support structure is fully inserted in the MCC with the first and second groups of signals being connected to the MCC; a second position corresponding to a test position in which the support structure is partially inserted in the MCC with the first group of signals being disconnected from the MCC and the second group of signals being connected to the MCC; and a third position corresponding to a disconnected position in which the support structure is partially inserted in the MCC with the first and second groups of signals being disconnected from the MCC; and sealing members attached to the opposing sidewalls in areas external to the interior volume of the electrical unit, in which the sealing members form barriers in gaps leading to an interior volume of the MCC between the opposing sidewalls and the MCC to provide arc fault protection when the support structure is partially inserted in the MCC in the second and third positions.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which:

FIG. 6B is a plan view the electrical unit in a test position, partially inserted in the MCC.

DETAILED DESCRIPTION OF THE OF THE INVENTION

Figure 1:
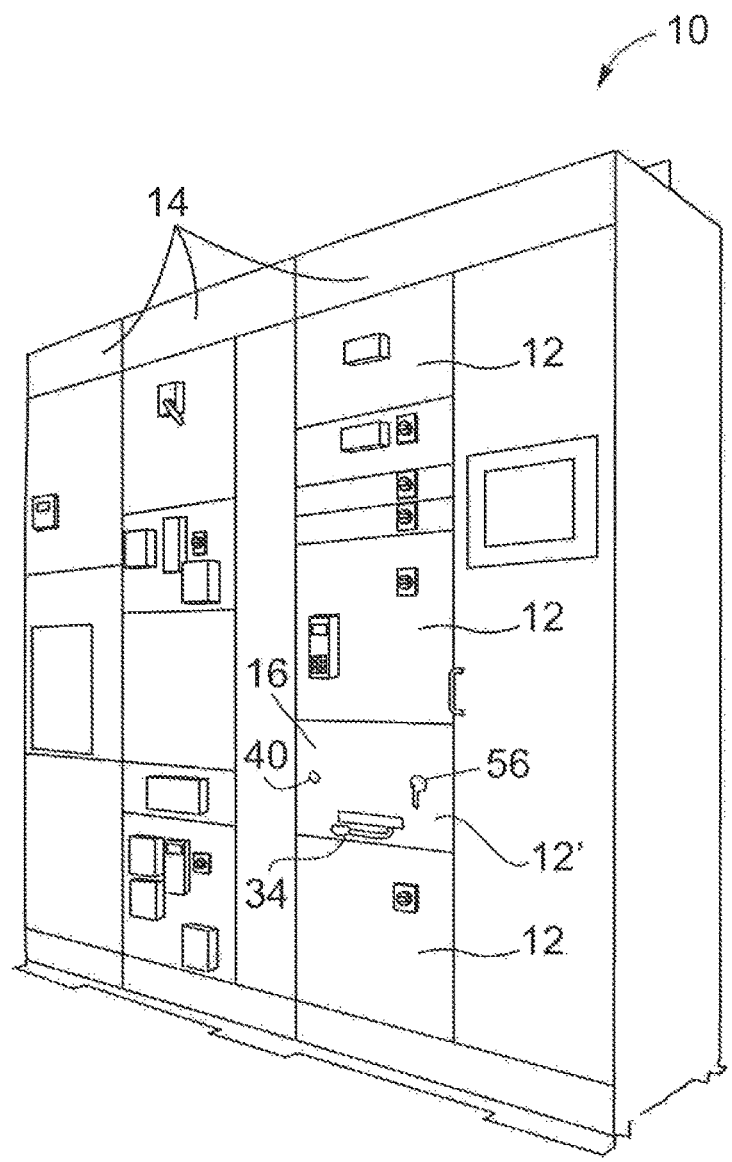
FIG. 1 is an isometric view of an exemplar electrical system which could be a Motor Control Center (MCC) in which an improved electrical unit can be housed in accordance with an aspect of the invention.
Figure 2:
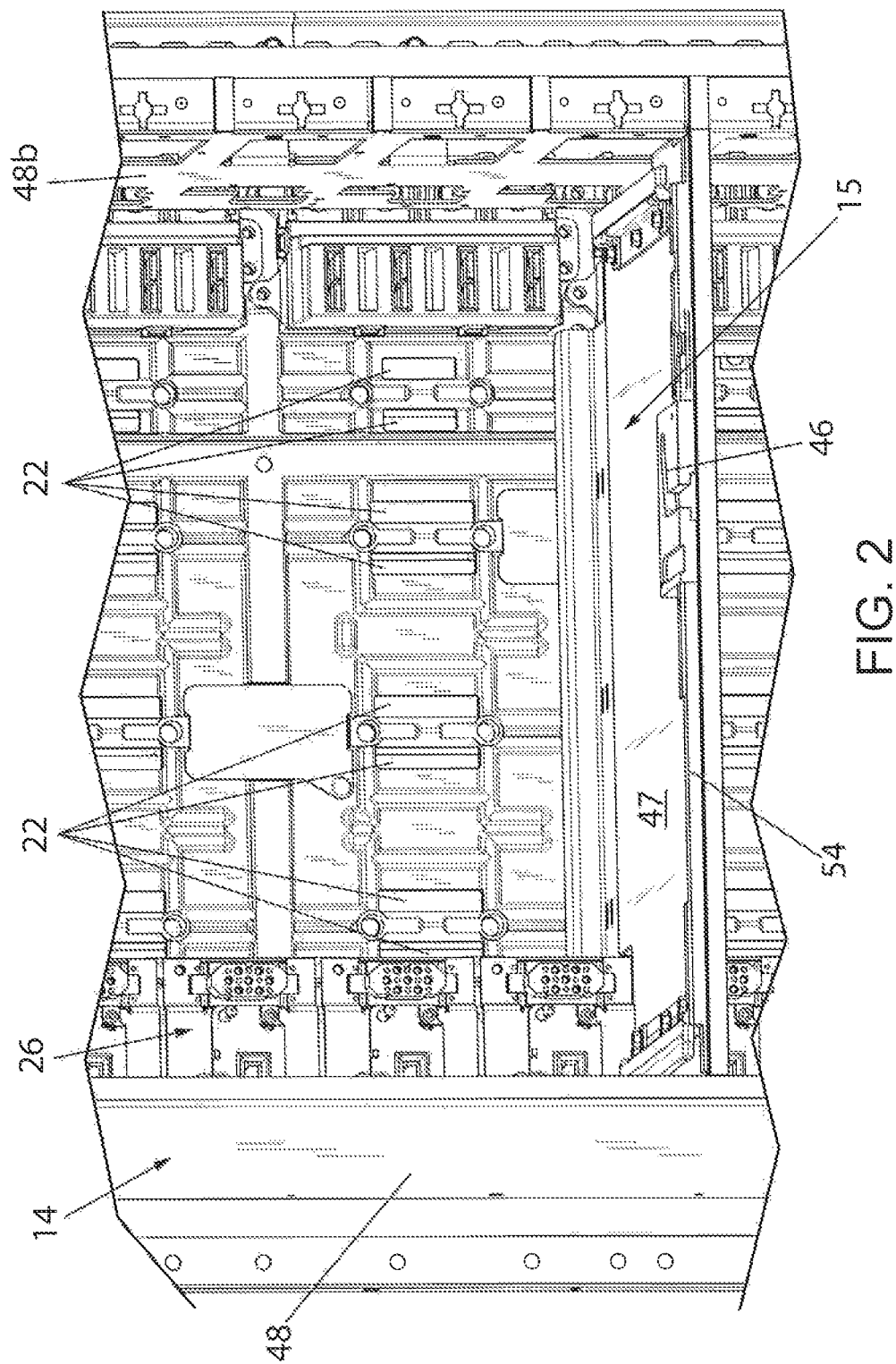
FIG. 2 illustrates a section forming a shell around a device mounting volume for supporting the improved electrical unit of FIG. 1.

Referring now to FIG. 1, an exemplar electrical system 10 is provided in which multiple electrical units 12 of various types may be housed. The electrical system 10 may be, for example, a Motor Control Center (MCC) or other industrial, commercial, marine, or other electrical system. With additional reference to FIG. 2, the electrical system 10 may generally provide one or more sections 14, each forming a shell around a device mounting volume 15 for supporting the units 12. The shell may be made of any suitable material, such as heavy gage sheet metal, reinforced plastics, and so forth. The electrical system 10 may typically receive three-phase electrical power from an external power supply, such as a power supply grid, and/or data signals, via appropriate conduits (not shown), and distribute the received power and/or data signals to one or more of the sections 14 in various manners. The sections 14 may be electrically isolated from one another, or alternatively, may be electrically joined with other sections 14, such as via common horizontal power buses.

It should be appreciated that the units 12 may be provided with varying configurations to achieve various purposes in the electrical system 10. In general, each unit 12 can include a front wall (or door) for covering an assembly of electrical components 18 that are housed and supported within an interior volume of the unit. The units 12, in turn, can be mounted in sections 14 via known methods, such as screwed ("fixed feed" or "frame mounted") or snap-in ("withdrawable") engagement via load stabs that are in communication with the interior volume, thereby providing mechanical and electrical connection to the electrical system 10. Exemplary electrical components 18 of the units 12 can include relays, motor starters, and Programmable Logic Controllers (PLC's), among others.

Figure 3:
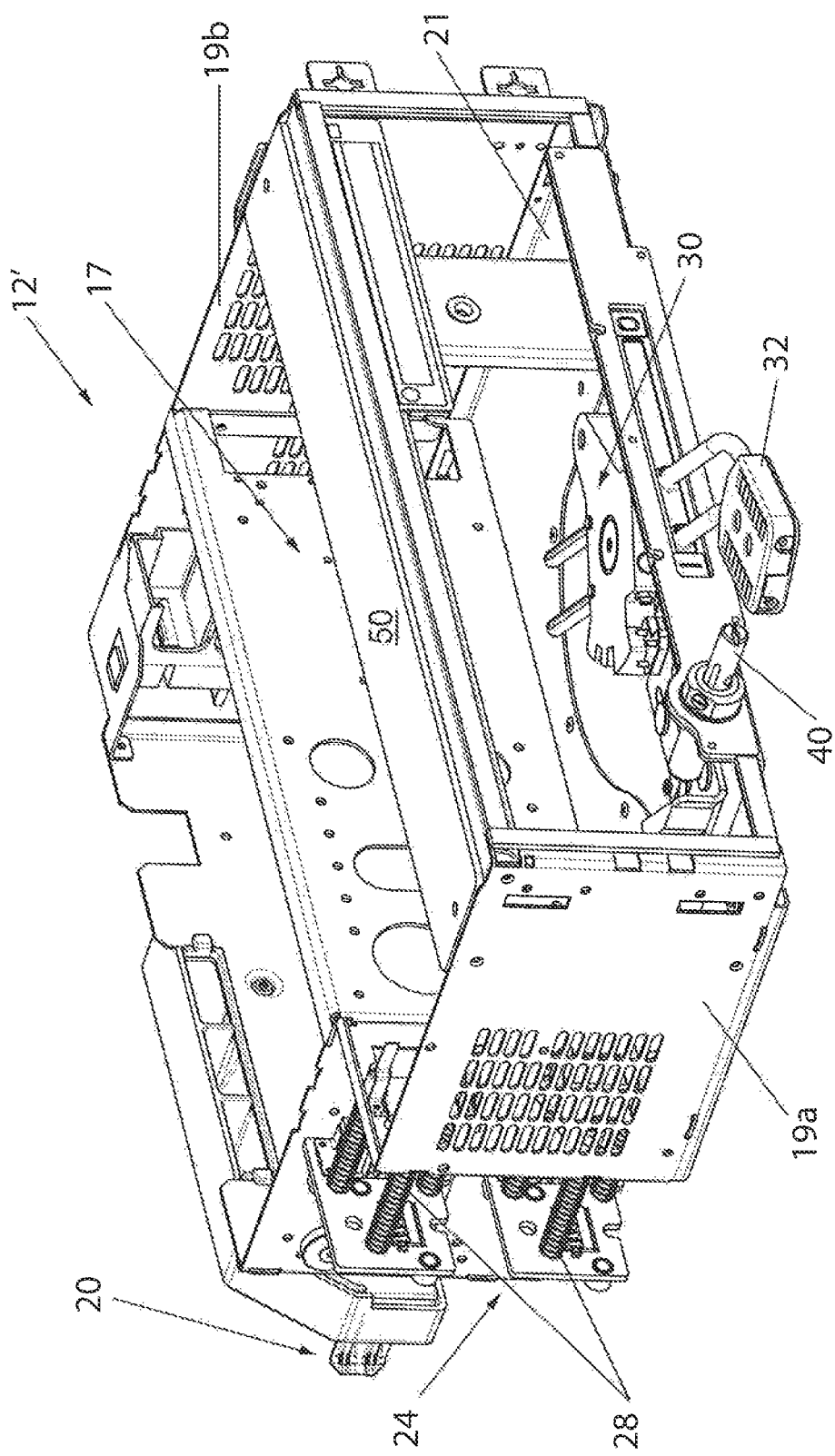
FIG. 3 is an improved electrical unit in accordance with an aspect of the invention.

With additional reference to FIG. 3, in accordance with an aspect of the invention, the system 10 can house an improved electrical unit 12'. Like other units 12, the unit 12' can include a front wall 16 (or door) for covering an assembly of electrical components 18 that are housed and supported within an interior volume 17 of the unit 12'. The front wall 16 can be attached to opposing sidewalls 19a and 19b of the unit 12', and the front wall 16 and opposing sidewalls 19 can each be attached to an underlying support structure 21 for supporting the electrical components 18. The unit 12', in turn, can be mounted in a section 14 of the system 10 in a known method, as described above, including by snap-in engagement, as shown, via load stabs 20 that are in communication with the interior volume, thereby providing mechanical and electrical connection to the electrical system 10. The unit 12' can be a full size electrical unit with a full size interior volume 17, able to advantageously accommodate a full array of electrical components 18, like the other electrical units 12.

When fully installed, the unit 12' can receive (electrically connect) first and second groups of signals from the system 10. The first group of signals can include multi-phase (AC) electrical power signals received through engagement of vertical bus bars 22 (FIG. 2) in the section 14 to which the load stabs 20 (FIG. 3) of the unit 12' can engage. The multi-phase electrical power signals, which could be the three-phase electrical power from an external power supply, such as a power supply grid, can be used to power industrial equipment, such as motors, variable frequency drives and the like.

The second group of signals can include communications and control signals, low power DC and AC (control power) signals, and the like, received through engagement of a prewired connector assembly 24 (FIG. 2) within the section 14 to which a component connector assembly 26 (FIG. 3) of the unit 12' can engage. As described in U.S. Pat. No. 7,419,394, "Electrical System Having Withdrawable Unit with Maintained Control and Communication Connection," assigned to Rockwell Automation, Inc., incorporated herein by reference, the connector assembly 24 can include compression springs 28 disposed on and around control rods or pins that are slidable through apertures in a base plate (and similar apertures in a rear panel of a component support) to allow compression of the springs 28. The springs 28 can therefore hold the connector assembly 24 in an electrically connected (normal or operative) position while allowing a limited range of inward and outward movement of the unit 12' within the section 14.

Figure 4:
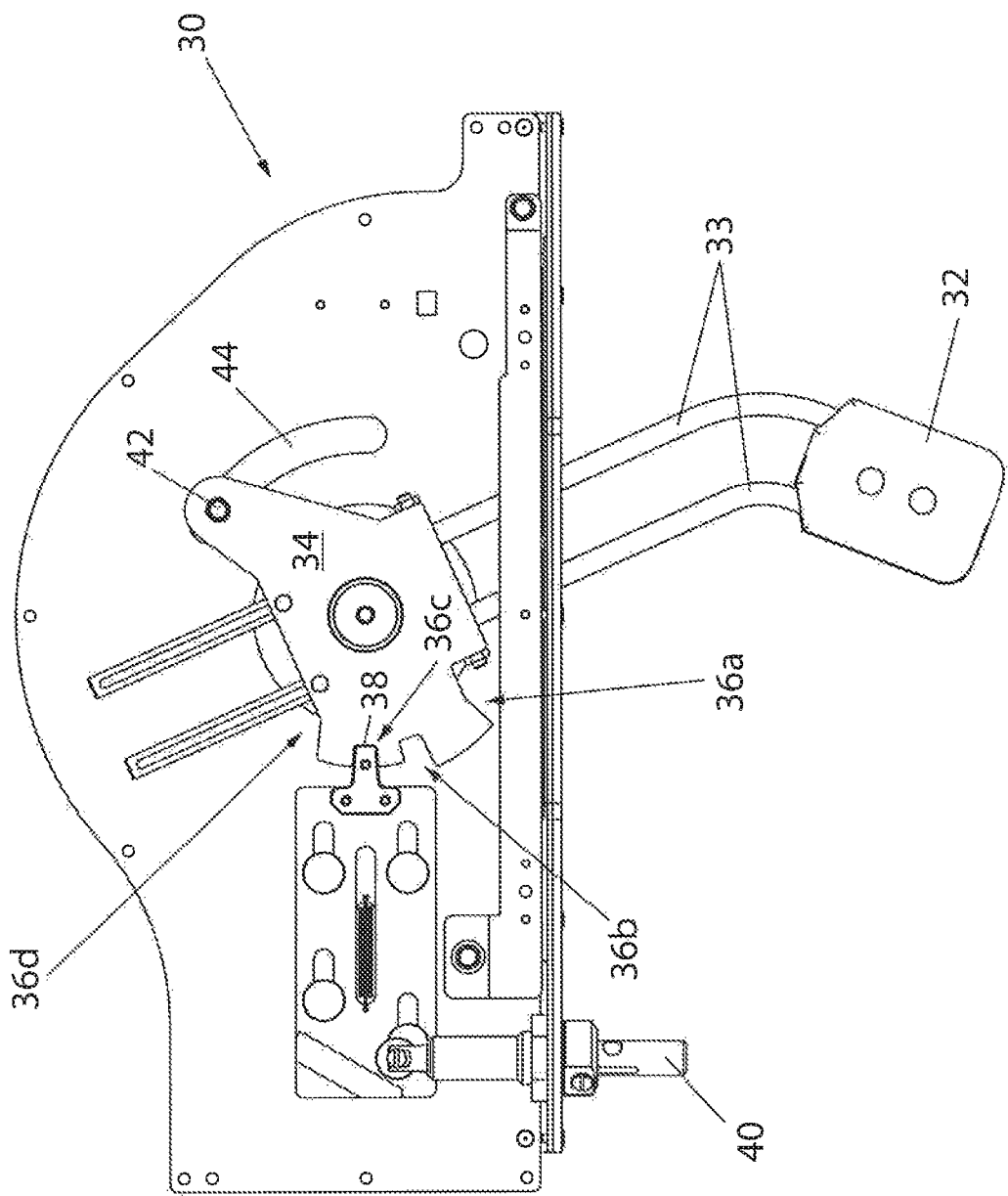
FIG. 4 is an actuating mechanism for selectively moving the improved electrical unit of FIG. 3, with respect to the MCC of FIG. 1, in accordance with an aspect of the invention.

Referring now to FIG. 4, an actuating mechanism 30 for selectively moving the unit 12' with respect to the section 14, and consequently with respect to the system 10, is provided in accordance with an aspect of the invention. As described in U.S. Patent Application Publication No. 2011/0110049, "Motor Control Center Unit Withdraw with Door Closed," assigned to Rockwell Automation, Inc., incorporated herein by reference, the actuating mechanism 30 can include a handle 32 protruding through the front wall 16, accessible by an operator exterior to the unit 12', which is configured to move the unit 12' between respective positions within the section 14 without having to open the unit 12'. The handle 32 can be integral with the unit 12' and thus an operator needs no special tool or other device to effect movement between its respective positions. Moreover, the handle 32 can be positively locked out if desired to prevent unauthorized or accidental movement.

The actuating mechanism 30 can comprise a gear 34 or cam pivotally mounted to the support structure 21, and a telescoping linkage 33 connecting the gear 34 to the handle 32, in which linear actuation of the handle 32 rotates the gear 34 to displace the entire unit 12', through the support structure 21, between multiple positions in the device mounting volume 15. The linkage 33 can retract inward when not in use, thereby minimizing exterior protrusion from the unit 12' and the potential for catching on articles, and can extend outward when necessary to provide increased leverage to move the unit 12' between the positions. The gear 34 can include multiple notches 36 for receiving a lock projection 38, actuated by a push button 40 protruding through the front wall 16, for locking the unit 12' in certain positions based on the notches 36 (movement of the handle 32 requires actuation of the push button 40). The notches 36 can include a first notch 36a for locking the unit 12' in a first position corresponding to a connected position (FIG. 6A), in which the support structure 21 is fully inserted in the section 14 with the first group of signals (multi-phase electrical power signals, load stabs 20 snapped-in to vertical bus bars 22) and the second group of signals (communications and control signals, including control power signals, with springs 28 compressed) all being connected; a second notch 36b for locking the unit 12' in a second position corresponding to a test position (FIG. 6B) in which the support structure 21 is partially inserted in the section 14 with the first group of signals being disconnected (load stabs 20 snapped-out of vertical bus bars 22) and the second group of signals being connected (springs 28 decompressed); a third notch 36c for locking the unit 12' in a third position corresponding to a disconnected position (FIG. 6C) in which the support structure 21 is partially inserted in the MCC with the first and second groups of signals all being disconnected; and a fourth notch 36d for unlocking the unit 12' in a fourth position corresponding to a withdrawal position (FIG. 6D) in which the support structure 21 can be fully withdrawn from the section 14. To achieve each of the aforementioned positions in the section 14, a pin 42 connected to the gear 34, extending through a curved slot 44 in the actuating mechanism 30, can engage a corresponding curved channel 46 in a support pan 47 (FIG. 2) provided in a lower portion of the device mounting volume 15. Moreover, the handle 32 and/or the push button 40 can provide lock-out/tag-out (LOTO) functionality, via apertures in the handle 32 and/or the push button 40, to positively lock the unit 12' in the device mounting volume 15 in given positions by inserting a lock or tag member through corresponding lock holes.

Figure 6A:
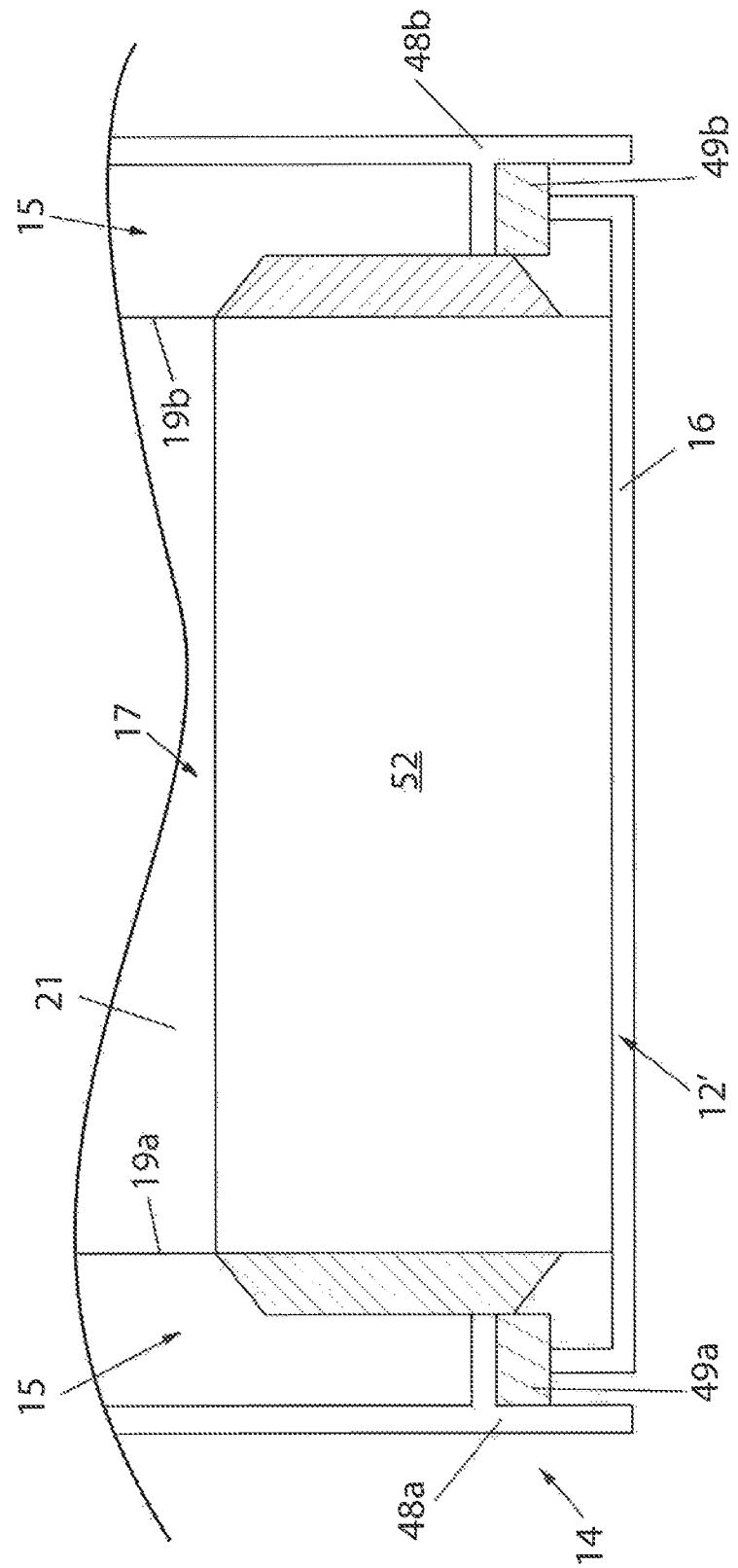
FIG. 6A is a plan view the electrical unit in a connected position, fully inserted in the MCC.

When the unit 12' is in the first position, i.e., the connected position, shown in a plan view in FIG. 6A, the unit 12' can provide adequate ingress protection by the front wall 16 and section walls 48 of the section 14, including opposing section walls 48a and 48b. Optional sealing caps 49, such as sealing caps 49a and 49b on opposing sides of the section 14, can also be provided between the front wall 16 and the section walls 48 to optimize fit as necessary. Also, when the unit 12' is in the fourth position, i.e., the withdrawal position, shown in a plan view in FIG. 6D, the unit 12' need not provide adequate ingress protection as the entire unit 12' is being removed from the section 14. However, in accordance with an aspect of the invention, when the unit 12' is in the second and/or third positions, i.e., the test and/or disconnected positions, shown in plan views in FIGS. 6B and 6C, the unit 12' provides improved ingress protection through sealing members. In one aspect, the sealing members can form barriers in gaps leading to an interior volume of the MCC and/or the unit 12' to provide arc fault protection when the support structure 21 is only partially inserted in the MCC at a certain position or in between certain positions.

Figure 5:
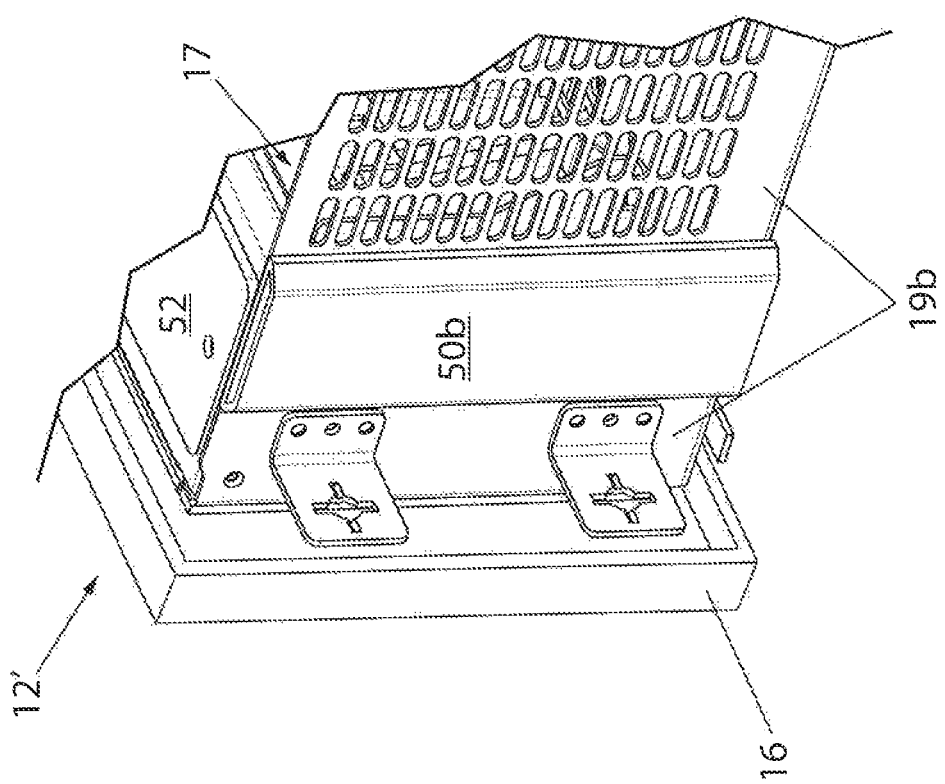
FIG. 5 is a detailed isometric view of a sealing member attached to the electrical unit of FIG. 3 for providing ingress protection in accordance with an aspect of the invention.
Figure 6C:
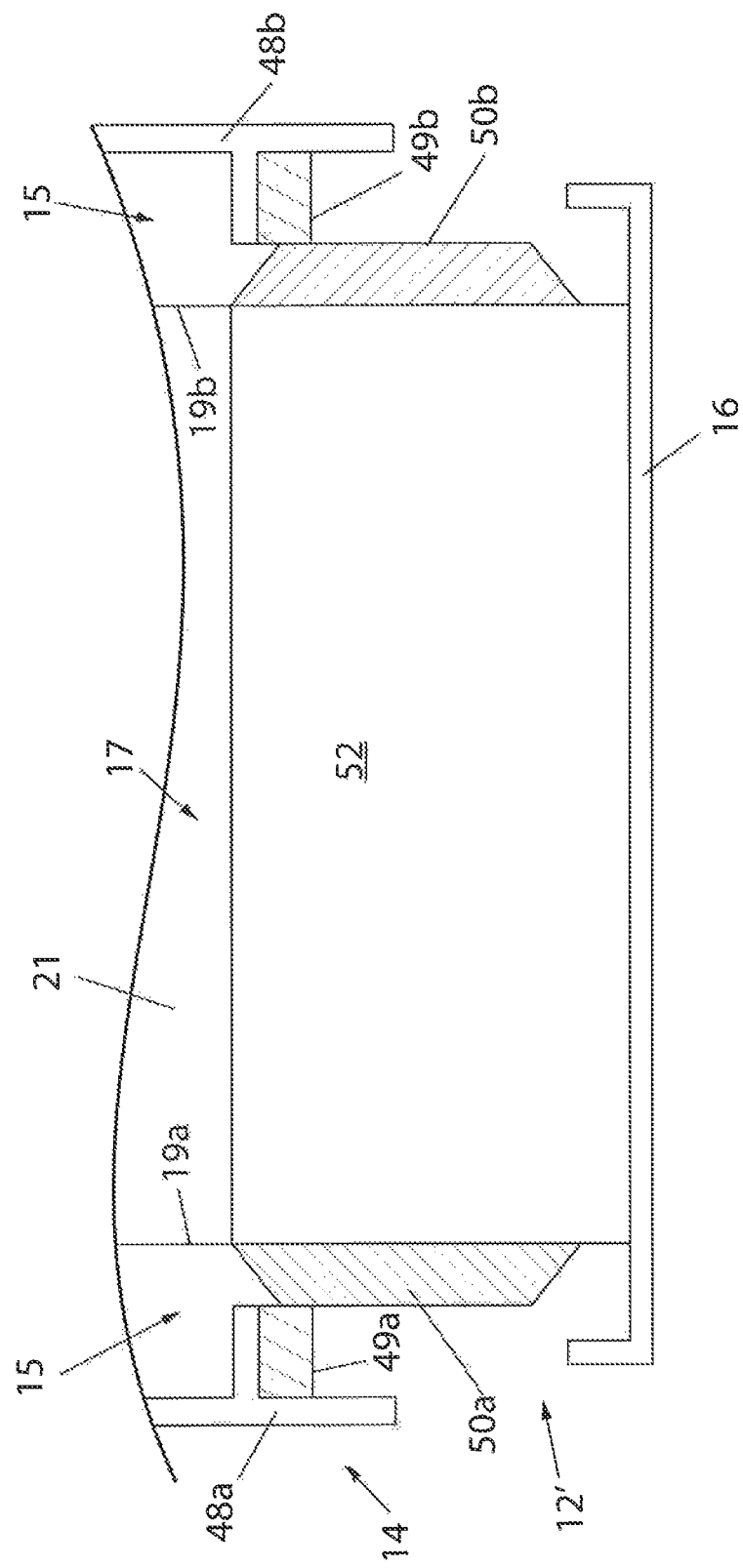
FIG. 6C is a plan view the electrical unit in a disconnected position, partially inserted in the MCC.
Figure 6D:
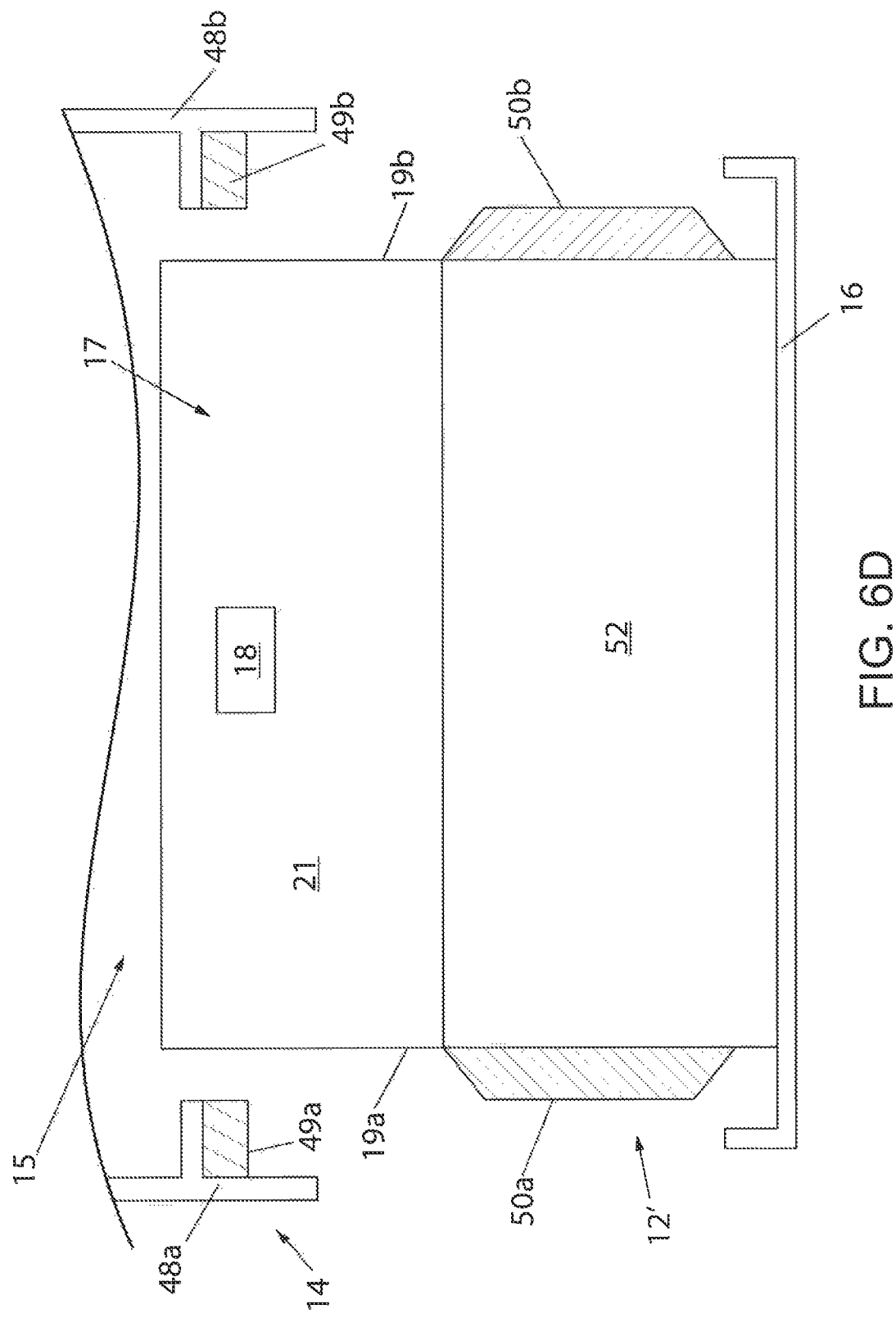
FIG. 6D is a plan view the electrical unit in a withdrawal position, almost completely withdrawn from the MCC, each in accordance with an aspect of the invention.

Referring now to FIGS. 5, 6B and 6C, sealing members 50, 52 and 54 can be attached to the unit 12' to form barriers in gaps leading to an interior volume of the MCC and/or the unit 12', thereby providing various ingress protections, including IP-3X, when the unit 12' is in the second and/or third positions, to provide arc fault protection. Moreover, the sealing members 50, 52 and 54 can provide such ingress barriers in gaps when the unit 12' is in between positions, such as in between the second and third positions. In one aspect, sealing members 50 can be attached to opposing sidewalls 19 in areas external to the interior volume of the electrical unit. Such sealing members 50 could be flexible components, such as gaskets, to seal gaps with greater tolerances, on sides of the unit 12' where increased room for lateral movement might exist. Such sealing members 50 can prevent access to the device mounting volume 15 of the section 14 between the opposing sidewalls 19 and the section 14, and/or the interior volume 17 of the unit 12', when the support structure 21 is only partially inserted in the MCC. Accordingly, such sealing members 50 not only prevent intrusion into the section 14 by a foreign object, but also escape of debris and/or gases from the section 14 and/or the unit 12', such as during an arc fault condition.

In another aspect, sealing member 52 can be attached to the front wall 16 and the opposing sidewalls 19 on top of the unit 12'. Such sealing members 52 could be rigid component, such as a plate, to seal gaps with lesser tolerances, such as on top of the unit with decreased room for upward/downward movement. A sealing member 54, which could be a rigid lip disposed on an edge of the support pan 47, can also provide counterpart sealing with respect to a bottom the unit 12'. Such sealing members 52 and 54 can prevent access to the device mounting volume 15 of the section 14 between the section 14 and the top of the unit 12', and/or the interior volume 17 of the unit 12', when the support structure 21 is only partially inserted in the MCC. Accordingly, such sealing members 52 and 54 not only prevent intrusion into the section 14 by a foreign object, but also escape of debris and/or gases from the section 14 and/or the unit 12', such as during an arc fault condition.

The unit 12' can also include a rotary circuit breaker 56 (such as a rotary lever to turn ON and OFF a Circuit Breaker inside the unit and enabling opening of the door when the Circuit Breaker is OFF, including to disconnect the first group of signals) protruding through the front wall 16, one or more lights on the front wall 16 for indicating a safe condition for moving the unit 12', and/or a user interface on the front wall 16 for monitoring and controlling aspects of the unit 12'.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:

1. An electrical unit for a Motor Control Center (MCC), comprising:
    a support structure for supporting an electrical component configured to receive first and second pluralities of signals from an MCC;
    a front wall and opposing sidewalls attached to the support structure, the front wall, the opposing sidewalls and the support structure forming an interior volume of the electrical unit containing the electrical component with the front wall providing a door;
    an actuating mechanism for selectively moving the electrical unit with respect to the MCC, the actuating mechanism having a handle protruding through the front wall, the handle being moveable between a plurality of positions including: a first position corresponding to a connected position in which the electrical unit is fully inserted in the MCC with the first and second pluralities of signals being connected; a second position corresponding to a test position in which the electrical unit is partially withdrawn from the MCC with the first plurality of signals being disconnected and the second plurality of signals being connected; and a third position corresponding to a disconnected position in which the electrical unit is partially withdrawn from the MCC with the first and second pluralities of signals being disconnected; and
    sealing members attached to the opposing, sidewalls in areas external to the interior volume of the electrical unit, wherein the sealing members form barriers in gaps leading to an interior volume of the MCC between the opposing sidewalls and the MCC to provide arc fault protection when the electrical unit is partially withdrawn from the MCC in the second and third position.

2. The electrical unit of claim 1, wherein the first plurality of signals comprises multi-phase electrical power signals.

3. The electrical unit of claim 2, further comprising a plurality of load stabs for connecting or disconnecting the multi-phase electrical power signals, wherein the load stabs snap-in to bus bars of the MCC to connect the multi-phase electrical power signals in the first position, and wherein the load stabs snap-out of bus bars of the MCC to disconnect the multi-phase electrical power signals in the second and third positions.

4. The electrical unit of claim 2, wherein the second plurality of signals comprises communications and control signals.

5. The electrical unit of claim 4, wherein the second plurality of signals further comprises electrical power signals providing lower power than the multi-phase electrical power signals.

6. The electrical unit of claim 1, further comprising a push button protruding through the front wall, wherein movement of the handle requires actuation of the push button.

7. The electrical unit of claim 1, wherein the electrical unit is locked in the MCC in the first, second and third position, and wherein the plurality of positions further includes a fourth position corresponding to a withdrawal position in which the electrical unit can be fully removed from the MCC.

8. The electrical unit of claim 1, wherein the sealing members are gaskets, and further comprising a sealing member that is a plate, the plate being attached to the front wall and the opposing sidewalls, wherein the plate opposes the support structure, and wherein the plate prevents access to the interior volume when the electrical unit is partially withdrawn from the MCC in the second and third positions.

9. The electrical unit of claim 1, wherein the actuating mechanism comprises a cam pivotally mounted to the support structure and a linkage connecting the cam to the handle.

10. The electrical unit of claim 1, further comprising a rotary circuit breaker protruding through the front wall, the rotary circuit breaker being configured to disconnect the first plurality of signals when in the first position.

11. The electrical unit of claim 1, wherein the sealing members form barriers in the gaps when the electrical unit is in between the second and third positions.

12. A Motor Control Center (MCC),
a section forming a shell around a device mounting volume for supporting an electrical unit, the electrical unit comprising:
a support structure for supporting an electrical component configured to receive first and second pluralities of signals from the MCC;
a front wall and opposing sidewalls attached to the support structure, the front wall, the opposing sidewalls and the support structure forming an interior volume of the electrical unit containing the electrical component with the front wall providing a door;
an actuating mechanism for selectively moving the electrical unit with respect to the MCC, the actuating mechanism having a handle protruding through the front wall, the handle being moveable between a plurality of positions including: a first position corresponding to a connected position in which the electrical unit is fully inserted in the MCC with the first and second pluralities of signals being connected to the MCC; a second position corresponding to a test position in which the electrical unit is partially withdrawn from the MCC with the first plurality of signals being disconnected from the MCC and the second plurality of signals being connected to the MCC; and a third position corresponding to a disconnected position in which the electrical unit is partially withdrawn from the MCC with the first and second pluralities of signals being disconnected from the MCC; and
sealing members attached to the opposing sidewalls in areas external to the interior volume of the electrical unit, wherein the sealing members form barriers in gaps leading to an interior volume of the MCC between the opposing sidewalls and the MCC to provide arc fault protection when the electrical unit is partially withdrawn from the MCC in the second and third positions.

13. The MCC of claim 12, wherein the first plurality of signals comprises multi-phase electrical power signals.

14. The MCC of claim 13, further comprising a plurality of load stabs for connecting or disconnecting the multi-phase electrical power signals, wherein the load stabs snap-in to bus bars of the MCC to connect the multi-phase electrical power signals in the first position, and wherein the load stabs snap-out of bus bars of the MCC to disconnect the multi-phase electrical power signals in the second and third positions.

15. The MCC of claim 13, wherein the second plurality of signals comprises communications and control signals.

16. The MCC of claim 12, further comprising a push button protruding through the front wall, wherein movement of the handle requires actuation of the push button.

17. The MCC of claim 12, wherein the electrical unit is locked in the MCC in the first, second and third position, and wherein the plurality of positions further includes a fourth position corresponding to a withdrawal position in which the electrical unit can be fully removed from the MCC.

18. The MCC of claim 12, wherein the sealing members are gaskets, and further comprising a sealing member that is a plate, the plate being attached to the front wall and the opposing sidewalls, wherein the plate opposes the support structure, and wherein the plate prevents access to the interior volume when the electrical unit is partially withdrawn from the MCC in the second and third positions.

19. The MCC of claim 12, wherein the actuating mechanism comprises a cam pivotally mounted to the support structure and a linkage connecting the cam to the handle.

20. The MCC of claim 12, further comprising a rotary circuit breaker protruding through the front wall, the rotary circuit breaker being configured to disconnect the first plurality of signals when in the first position.

* * * * *